(12) United States Patent
Van Der Tempel et al.

(10) Patent No.: US 10,509,126 B2
(45) Date of Patent: Dec. 17, 2019

(54) METHOD FOR DRIVING A TIME-OF-FLIGHT SYSTEM

(71) Applicant: SOFTKINETIC SENSORS NV, Brussels (BE)

(72) Inventors: Ward Van Der Tempel, Keerbergen (BE); Thomas Finateu, Brussels (BE); Kyriaki Korina Fotopoulou, Brussels (BE)

(73) Assignee: Sony Depthsensing Solutions SA/NV, Brussels (BE)

( * ) Notice: Subject to any disclaimer, the term of this patent is extended or adjusted under 35 U.S.C. 154(b) by 474 days.

(21) Appl. No.: 14/897,275

(22) PCT Filed: Jan. 8, 2015

(86) PCT No.: PCT/EP2015/050195
§ 371 (c)(1),
(2) Date: Dec. 10, 2015

(87) PCT Pub. No.: WO2015/104307
PCT Pub. Date: Jul. 16, 2015

(65) Prior Publication Data
US 2016/0306045 A1    Oct. 20, 2016

(30) Foreign Application Priority Data
Jan. 13, 2014    (EP) .................................... 14150922

(51) Int. Cl.
*G01C 3/08* (2006.01)
*G01S 17/89* (2006.01)
*G01S 17/36* (2006.01)

(52) U.S. Cl.
CPC ............ *G01S 17/89* (2013.01); *G01S 7/4914* (2013.01); *G01S 17/36* (2013.01)

(58) Field of Classification Search
CPC .......... G01S 17/89; G01S 7/4914; G01S 17/36
See application file for complete search history.

(56) References Cited

U.S. PATENT DOCUMENTS 6,825,455 B1    11/2004    Schwarte
8,767,189 B2    7/2014    Mase et al.
(Continued)

FOREIGN PATENT DOCUMENTS

CN    1233323 A    10/1999
CN    101784911 A    7/2010
(Continued)

OTHER PUBLICATIONS

European Communication for European Application No. EP 14150922.4 dated May 23, 2014.
(Continued)

*Primary Examiner* — Samantha K Abraham
(74) *Attorney, Agent, or Firm* — Wolf, Greenfield & Sacks, P.C.

(57) ABSTRACT

The present invention relates to a method for driving a Time-of-Flight system for use with an illumination system being adapted to illuminate a scene with a modulated signal, the ToF system having an imaging sensor comprising at least one pixel, said pixel comprising taps driven by driving signals for detecting the modulated signal reflected from the scene, the method comprising, for each pixel, the steps of determining at least a first and a second pair of taps and driving each pair of taps to detect the reflected modulated signal during a predetermined number N of cycles of the modulated signal.

15 Claims, 6 Drawing Sheets

(56) References Cited

U.S. PATENT DOCUMENTS

2009/0051984 A1    2/2009  O'Brien et al.
2010/0231891 A1    9/2010  Mase et al.

FOREIGN PATENT DOCUMENTS

| CN | 101785319 A | 7/2010 |
|----|----|----|
| CN | 102027388 A | 4/2011 |
| EP | 2187237 A1 | 5/2010 |
| JP | 2009-047662 A | 3/2009 |
| JP | 2010-537555 A | 12/2010 |
| KR | 10-2010-0062975 A | 6/2010 |
| WO | WO 2009/025373 A1 | 2/2009 |
| WO | WO 2009/025825 A1 | 2/2009 |
| WO | WO 2014/102442 A1 | 7/2014 |

OTHER PUBLICATIONS

European Communication for European Application No. EP 14150922.4 dated Oct. 20, 2017.

Japanese Communication for Japanese Application No. 2016-518541 dated Nov. 16, 2018.

2tap driving mode

Figure 10

METHOD FOR DRIVING A TIME-OF-FLIGHT SYSTEM

CROSS-REFERENCE TO RELATED APPLICATIONS

This application is a § 371 national stage entry of International Application No. PCT/EP2015/050195, filed Jan. 8, 2015, which claims priority to European Patent Application No. 14150922.4 filed Jan. 13, 2014, the entire contents of which are incorporated herein by reference.

TECHNICAL FIELD OF THE INVENTION

The instant invention relates to Time-of-Flight systems and more particularly to a method for driving a Time-of-Flight system.

BACKGROUND OF THE INVENTION

Computer vision is a growing research field that includes methods for acquiring, processing, analyzing and understanding images. The main driving idea in that field is to duplicate the abilities of human vision by electronically perceiving and understanding images of a scene. Notably, one theme of research in computer vision is the depth perception or, in other words, the three-dimensional (3-D) vision.

Time-Of-Flight (ToF) systems, including a camera and data processing means, appeared recently and are capable of capturing 3-D images of a scene by analysing the time of flight of light from a light source to an object. Such camera systems are used in many applications where depth or distance information from a fixed point is required.

Figure 1:
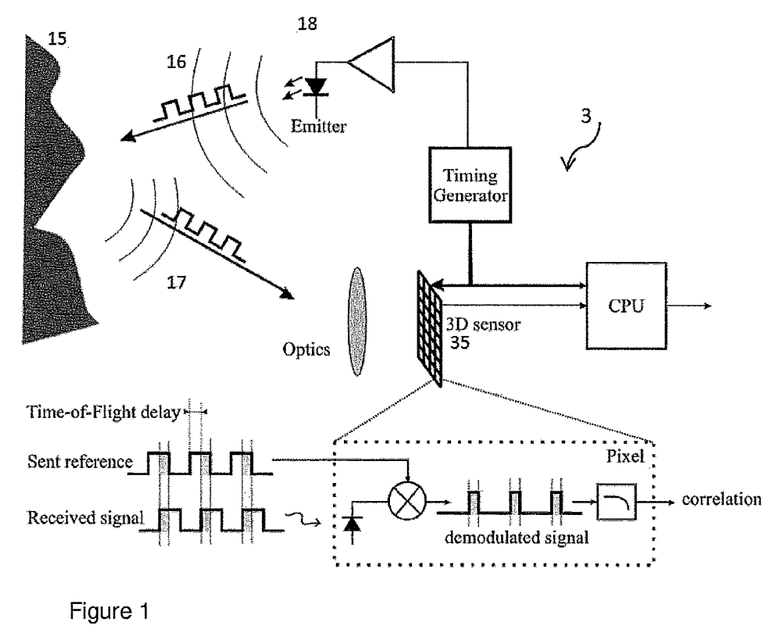
FIG. 1 illustrates the basic operational principle of a ToF system.

The basic operational principle of a ToF system 3, illustrated by FIG. 1, is to illuminate a scene 15 with a modulated light 16, such as pulses. The modulated light 16 is reflected back from objects within the scene 15 and a lens collects the reflected light 17 and forms an image of objects in the scene on an imaging sensor 35, and in particular, on a sensor plane of the sensor. Depending on the distance of objects from the camera, a delay is experienced between the emission of the modulated light, e.g. pulses, and the reception of their reflection at the camera. For example, an object 2.5 m away from the camera causes a time delay of 16.66 ns. By analysing this delay, and in particular by implementing correlation calculation, the distance of said object from the camera can be retrieved.

The distance of objects from camera can be calculated as follows. For clarity purposes, an example of signals is given FIG. 2. A modulation signal 16 (S) is sent towards an object. After reflection on the object, a signal 17 ($S_\varphi$) is detected by a photodetector. This signal $S_\varphi$ is phase-shifted by a phase $\varphi$ compared to the original signal S, due to the travelling time.

Figure 2:
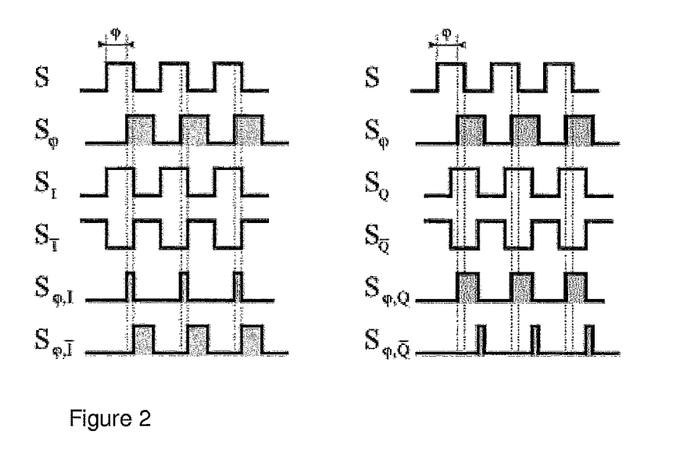
FIG. 2 illustrates an example of signals used to determine correlation measurements in a ToF system.

$\varphi$ is a key parameter for measuring the distance of objects from camera. To measure this parameter, the photodetected signal $S_\varphi$, is usually correlated with electrical reference signals named $S_I$, $S_{\bar{I}}$, $S_Q$ and $S_{\bar{Q}}$. $S_I$, $S_{\bar{I}}$, $S_Q$ and $S_{\bar{Q}}$ are electrical reference signals shifted by 0°, 180°, 90° and 270° respectively, compared to the original optical signal S, as illustrated in FIG. 2. The correlation signals obtained are defined as follows:

$$S_{\varphi,I} = S_\varphi \cdot S_I$$

$$S_{\varphi,\bar{I}} = S_\varphi \cdot S_{\bar{I}}$$

$$S_{\varphi,Q} = S_\varphi \cdot S_Q$$

$$S_{\varphi,\bar{Q}} = S_\varphi \cdot S_{\bar{Q}}. \tag{eq. 1-4}$$

Then, two parameters I and Q are calculated such that:

$$I = A_S \cdot \alpha \cdot (S_{\varphi,I} - S_{\varphi,\bar{I}}) \text{ and}$$

$$Q = A_S \cdot \alpha \cdot (S_{\varphi,Q} - S_{\varphi,\bar{Q}}). \tag{eq. 5-6}$$

$A_S$ and $\alpha$ are, respectively, the amplitude change of the photodetected signal $S_\varphi$ and the efficiency of the correlation. The extraction of $\varphi$ depends on the shape of the modulation signal S. For example, if S is a sine wave, then $$\varphi = \begin{cases} \arctan\dfrac{Q}{I} & \text{if } I, Q \geq 0 \\ \arctan\dfrac{Q}{I} + \pi & \text{if } I < 0 \\ \arctan\dfrac{Q}{I} + 2\pi & \text{if } Q < 0, I \geq 0 \end{cases} \tag{eq. 7-9}$$

Once the phase $\varphi$ is known, the distance $D_\varphi$ of objects from camera can be retrieved thanks to the following formula:

$$D_\varphi = \frac{c \cdot (\varphi + 2\pi \cdot n)}{4\pi \cdot f_{mod}} \tag{eq. 10}$$

where $f_{mod}$ is the modulation frequency and n is a integer number of $\mathbb{N}$.

From equations 1-4, one can notice that, in theory, it should be the same signal $S_\varphi$ which is correlated with reference signals $S_I$, $S_{\bar{I}}$, $S_Q$ and $S_{\bar{Q}}$ to obtain $S_{\varphi,I}$, $S_{\varphi,\bar{I}}$, $S_{\varphi,Q}$ and $S_{\varphi,\bar{Q}}$, respectively.

In practice, ToF measurements are generally carried out by ToF sensors comprising an array of ToF pixels. In prior art, each of these pixels comprise generally one or two "taps". A "tap" is a component comprising a control node and a detection region, used to photogenerate charges when exposed to optical signals such as $S_\varphi$. The fact of having only one or two taps per pixel involves that, in practice, the measure of $S_\varphi$ is time-sequential. For example, a pixel comprising only one tap has to measure successively 4 distinct signals, $S_{\varphi\ 1-4}$, in order to calculate I, Q and then $D_\varphi$. In these configurations, several exposures occur and, if in between each exposure the object has moved, then the depth data $D_\varphi$ is corrupted.

The fact of using only one or two taps per pixel is problematic for matters of consistency of the depth calculation, but not only. It is also problematic for design reasons. Indeed, if several distinct signals $S_{\varphi\ i}$ are measured, a memory has to be added in pixels, on the sensor or on a system level in order to store the signals $S_{\varphi\ i}$ before calculation steps. The size of ToF systems is then dramatically increased.

Figure 3:
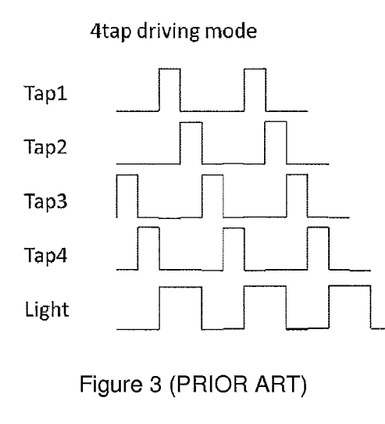
FIG. 3 illustrates a commonly-used 4-tap driving mode wherein each tap is enabled for 25% of the modulation period.

Finally, when several taps are comprised in a single pixel, the driving signals used to drive them are often not optimal as the bandwidth required is too high. When a positive potential is applied to a tap with respect to the other taps, the tap is activated and the detectivity is high, meaning the detection region of the activated tap will be receiving the majority of the photogenerated minority carriers in the pixel. With a 4-tap pixel architecture, a straightforward approach is to enable each of the four taps for 25% of the modulation period, as illustrated in FIG. 3. For a sent modulated signal with frequency 50 MHz, the 4-tap device taps will need a response time equivalent to 100 MHz due to the 25% duty cycle of each tap.

Despite what has been presented in prior art, a method and a system remain to be proposed in order to measure non-biased distances of object from ToF system while reducing both the size of the ToF systems and the bandwidth required for the taps.

SUMMARY OF THE INVENTION

The present invention relates first to a method for driving a Time-of-Flight system for use with an illumination system being adapted to illuminate a scene with a modulated signal, the ToF system having an imaging sensor comprising at least one pixel, said pixel comprising taps driven by driving signals for detecting the modulated signal reflected from the scene, the method comprising, for each pixel, the steps of determining at least a first and a second pair of taps and driving each pair of taps to detect the reflected modulated signal during a predetermined number N of cycles of the modulated signal.

It is an advantage of the present invention that each pair of taps is operated at 50% duty cycle during a time of N cycles of the modulated signal, which enables to reduce the bandwidth required for the taps.

It is a further advantage of the present invention that, when determining correlation measurements, the motion robustness is improved as signals $S_{\varphi,i}$ are measured almost at the same time.

It is yet another advantage that there is no need anymore of memories for storing the individual $S_{\varphi,i}$ datas first, which enables reducing the size of the ToF systems.

The present invention also relates to a Time-of-Flight system for use with an illumination system adapted to illuminate a scene with a modulated signal, the Time-of-Flight system comprising an imaging sensor comprising at least two pixels, each pixel comprising taps, a signal generator for generating driving signals for driving said taps, tap drivers adapted for receiving the driving signals from the signal generator and transmitting them to the taps, characterized in that each pixel comprises at least two pairs of taps, the taps of said two pairs of each pixel are connected to different drivers, respectively, and each driver is connected to a tap of each pixel, the taps of the pixels of the imaging sensor connected to said each driver forming a set of taps.

The method and the system of the instant case are obviously linked by the same inventive concept being the driving of pairs of taps, preferably during a predetermined number N of cycles of the modulated signal.

It is an advantage of the system of the present invention that each pixel comprises 4 taps, which enables determining 4 correlation measurements almost at the same time, namely $S_{\varphi,I}$, $S_{\varphi,\bar{I}}$, and $S_{\varphi,Q}$ and $S_{\varphi,\bar{Q}}$.

It is a further advantage of the invention that each pixel is spatially organized to define a plurality of axes of symmetry, which enables obtaining more accurate measurements.

It is yet another advantage that each pixel is octagonally shaped, which enables sharing the circuitry between a plurality of pixels while obtaining even more accurate measurements.

BRIEF DESCRIPTION OF THE DRAWINGS

The present invention shall be better understood in light of the following description and the accompanying drawings.

Advantages and novel features of the invention will become more apparent from the following detailed description when taken in conjunction with the accompanying drawing.

DESCRIPTION OF THE INVENTION

The present invention will be now described with respect to 4-tap pixels but this is not limited thereto. The invention may be implemented with pixels comprising a plurality of taps, preferably at least three taps, and even more preferably four taps.

Figure 4:
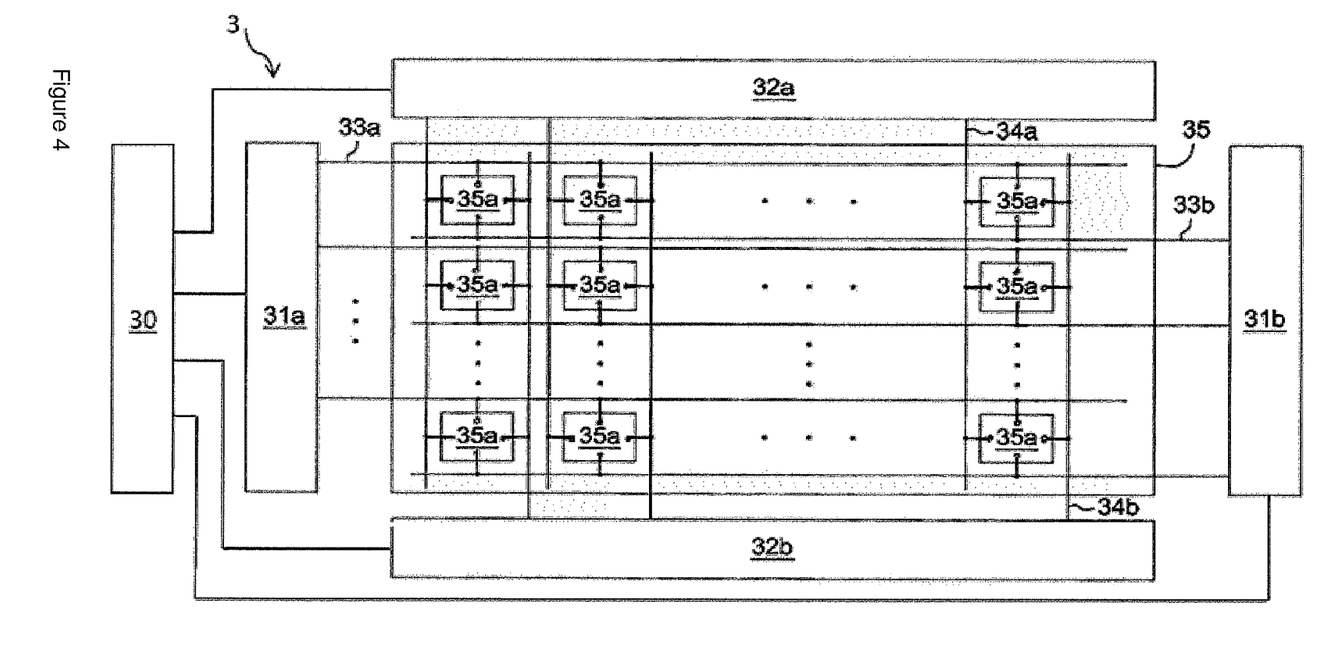
FIG. 4 illustrates a ToF system according to an embodiment of the invention.

FIG. 4 illustrates a Time-of-Flight system 3 according to a first embodiment of the invention. The ToF system 3 is for use with an illumination system 18 adapted to illuminate a scene with a modulated light 16 made of several cycles. The illumination unit 18 may comprise one or more light sources for emitting the modulated light 16. The modulated light 16 may be a periodic light. The periodic light can be in the form of waves or pulses or combinations of the two. The light may be in a visible or non-visible region of the spectrum, e.g. preferably in the infra-red domain so as to be in a range for which, sensors systems are efficient, the human eye is blind and suitable light sources are available such as LED's, LASERs, etc.

The ToF system 3 comprises an imaging sensor 35 comprising an array of pixels 35a, each of said pixels comprising four taps. The imaging sensor 35 is used to detect the modulated signal reflected 17 from the scene. Each pixel comprises four taps designated herein after as up-taps, left-taps, down-taps and right-taps, respectively. The basic design and operations of 4-tap pixels are explained later on.

The ToF system 3 further comprises a signal generator 30 for generating driving signals. The driving signal bursts per pair may be a predetermined number N of cycles of the modulated signal. The number N can potentially be modulated throughout operation, but preferably with momentarily equal N for the different tap pair drivers. The signal generator 501 may be adapted to provide driving signals to the taps being phase-shifted signals compared to the modulated signal sent by the illumination unit. Driving signals are signals for controlling the operations of the taps i.e. controlling if they are active or inactive. When a tap is active, it means that it may detect a signal, i.e. a modulated signal reflected 17 from the scene. The signal generator can be a block generating the different tap signals out of a base clock or frequency. It can be a PLL or a DLL or something similar with some glue logic.

The ToF system 3 further comprises four tap drivers 31a, 31b, 32a, 32b, each tap driver being adapted for receiving the driving signals from the signal generator 30 and transmitting them to the taps, via data lines 33a, 33b, 34a, 34b. Each tap driver receives a digital signal from the signal generator 30 and transmits it with the correct voltage levels and current densities towards a predetermined set of taps, via the data lines.

The ToF system is characterized in that each pixel comprises at least two pairs of taps, the taps of said two pairs of each pixel are connected to different drivers, respectively, and each driver is connected to a tap of each pixel, the taps of the pixels of the imaging sensor connected to said each driver forming a set of taps.

Preferably, the number of tap drivers is at least equal to the number of taps per pixel.

For instance, in FIG. 4, the data lines 31a, 32b, 31b and 32a are used to connect tap drivers with a predetermined set of taps. For example, in FIG. 4, tap driver 32a is associated to the left-taps of pixels 35a via data lines 34a, tap driver 31a is associated to the up-taps of pixels 35a via data lines 33a, tap driver 32b is associated to the right-taps of pixels 35a via data lines 34b and tap driver 31b is associated to the down-taps of pixels 35a via data lines 33b. This organisation means that each tap of a predetermined set of taps receive the same driving signals from the associated tap driver and that the set of taps is enabled to detect simultaneously the same modulated signal reflected from the scene.

Figure 5:
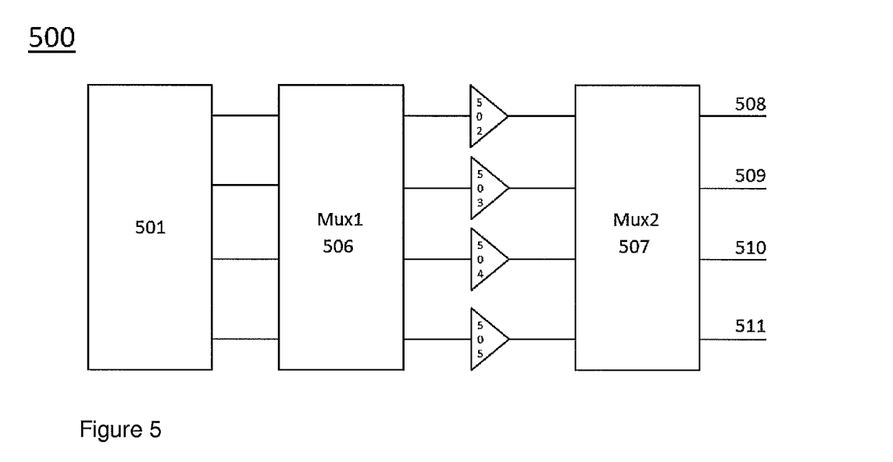
FIG. 5 illustrates a driving unit comprising a plurality of tap drivers, a plurality of multiplexers and a signal generator.

FIG. 5 illustrates another embodiment of the present invention. The ToF system 3 may further comprise at least one multiplexers associated to the tap drivers. FIG. 5 illustrates a driving unit 500 comprising four tap drivers 502, 503, 504 and 505, two multiplexers 506 and 507, a signal generator 501 and four data lines 508, 509, 501 and 511. The multiplexers 506 and 507 are connected before and/or after the tap drivers. The multiplexers enable to remove possible offsets and mismatches in the driving signals. They may also enable to permute both input and output signals of the tap drivers.

Figure 6:
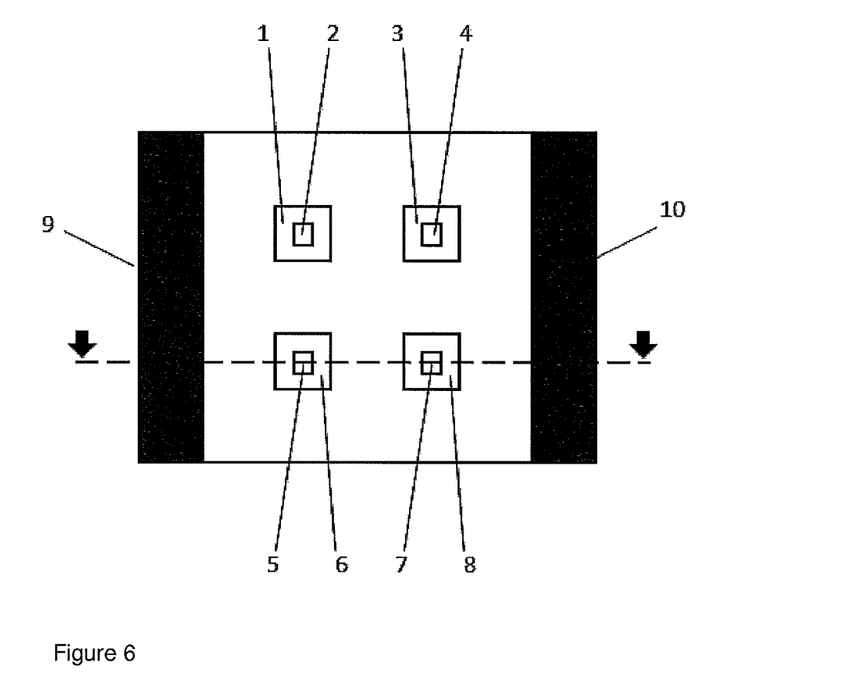
FIG. 6 illustrates a 4-tap topology of a pixel, according to an embodiment of the invention.

FIG. 6 illustrates a 4-tap topology of a pixel. The pixel contains four demodulation nodes or taps. Each tap consists of a control node (i.e. a substrate contact) 1, 3, 5 and 7 and a detection region 2, 4, 6, and 8, respectively. The pixel comprises also the circuitry 9, 10 associated to the taps.

Figure 7:
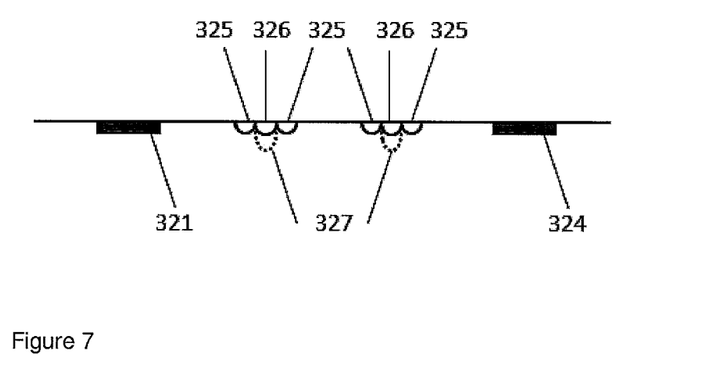
FIG. 7 shows a cross-section along the dotted line of the 4-tap pixel illustrated in FIG. 6.

FIG. 7 shows a cross-section along the dotted line of the 4-tap pixel illustrated in FIG. 6. Each tap consists of a detection region 326 being surrounded by a control node 325. Each detection region 326 may be associated to a depletion region 327. Elements 321 and 324 are circuitry elements. Circuitry elements 321, 324, and control node 325 may be highly doped regions $p^+$ whereas the detection region 326 may be an n-type region.

In EP1513202 B1, a similar device has been presented, wherein pixels comprise only one tap. The same physical principles are applicable here for explaining how the 4-tap pixel works. In short, by controlling the potential applied between the circuitry 321 (or 324) and the control node 325, it is possible to control the detectivity of the associated tap. When a photon is incident within the photosensitive area of a pixel, an electron-hole $e^-/h^+$ pair may be generated at a certain position. The electron-hole pair will be separated by an electrical field that is present and that is associated to the flowing majority current. This electrical field will cause the photogenerated minority carriers to drift in the opposite direction to the flowing majority current, i.e. towards the regions 325. By diffusion, finally, the minority carriers will arrive in the detection region 326.

Basically, when a pixel comprises several taps and when a positive potential is applied to a tap with respect to the other taps, the tap is activated and the detectivity is high, meaning that the detection region of the activated tap will be receiving the majority of the photogenerated minority carriers in the pixel. The driving signals i.e. the potential signals applied to the taps are crucial as they control which tap is activated and when.

Figure 8:
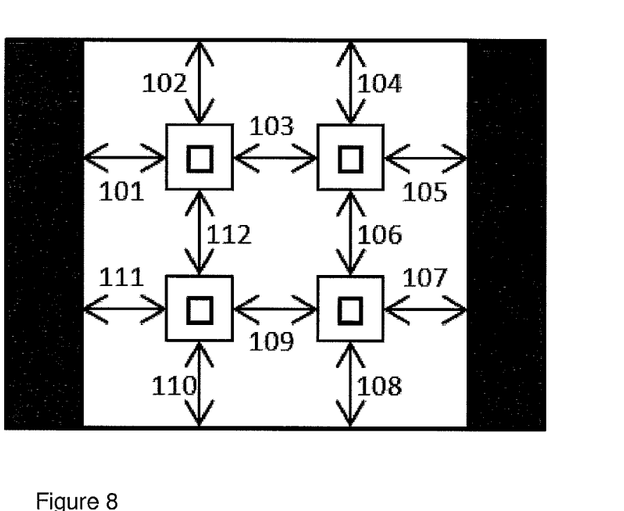
FIG. 8 illustrates a 4-tap topology of a pixel, according to another embodiment of the invention.

FIG. 8 illustrates a 4-tap topology of a pixel, according to an embodiment of the invention. The taps may be spatially organized to define a plurality of axes of symmetry. The taps may be spatially organized inside the pixel such as the distances 101 to 102 are substantially equal. These distances may defined by the available optical area between the components. For example, distances 103, 106, 109 and 112 between the detection regions of taps may be substantially equal. Furthermore, the distances 102, 104, 105, 107, 108, 110, 111, 101 and 102 between the detection regions and the closest surrounding circuitry may also be substantially equal. The fact of organizing spatially the taps to define a plurality of axes of symmetry inside the pixels is advantageous. Indeed, the taps are associated to an equal surface of optical area and experience equal influence from the surrounding circuitry. This spatial organization enables measuring modulated signals reflected from the scene substantially equal. In other words, this spatial organization enables measuring 4 signals $S_{\varphi\_1-4}$ being substantially equal to $S_\varphi$.

Figure 9:
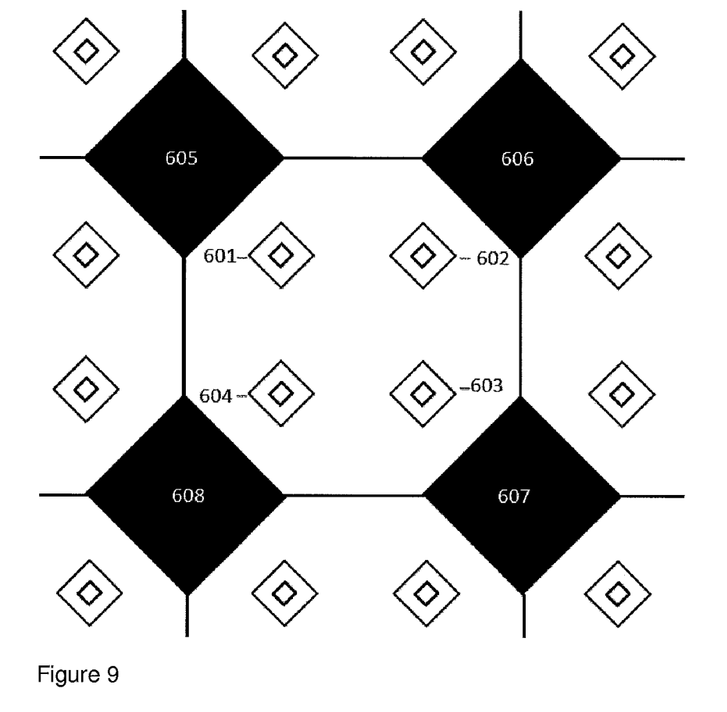
FIG. 9 illustrates a 4-tap topology of a pixel, according to a further embodiment of the invention.

FIG. 9 illustrates a 4-tap topology of a pixel, according to a further embodiment of the invention. The imaging sensor of the ToF system may comprise octagonally shaped pixels. Each pixel may comprise four taps 601, 602, 603 and 604, surrounded by circuitry 605, 606, 607 and 608. The octagonal shape of pixel may be advantageous. This particular shape enables sharing the circuitry between several pixels and taps, while optimizing the surface of substrate used and the optical area of pixels. The octagonal shape enables also defining several axes of symmetry inside pixels, which helps measuring more accurately modulated signals reflected from the scene.

The present invention also relates to a method for driving a Time-of-Flight system having an imaging sensor comprising at least one pixel, said pixel comprising a plurality of taps driven by driving signals, the Time-of-Flight system being for use with an illumination system being adapted to illuminate a scene with a modulated signal, the method comprising the steps of, for each pixel, determining at least a first and a second pair of taps and driving each pair of taps to detect the modulated signal reflected from the scene during a predetermined number N of cycles of the modulated signal.

For illustration purposes, the method will be explained with respect to a 4-tap pixel comprising four taps, designed by tap1 to tap4, but the method is not limited thereto.

Figure 10:
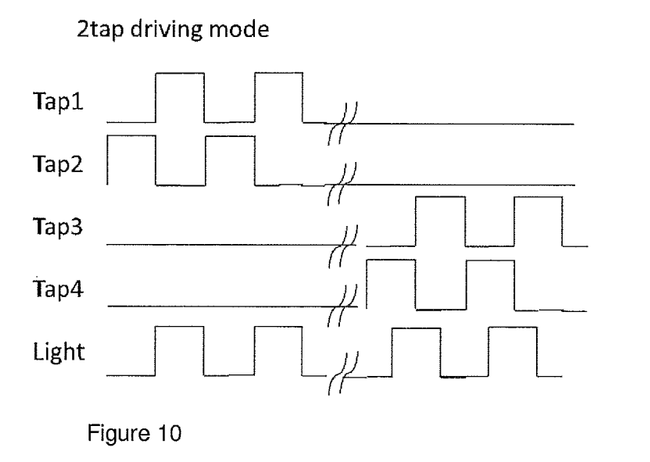
FIG. 10 illustrates an example of driving signals according to an embodiment of the present invention.

FIG. 10 shows an example of driving signals used to drive the taps during the second step of the method, wherein N is equal to 2. In this Figure, the modulated signal 16 is represented by the signal called "light".

According to the first step of the method, a first and a second pair of taps are determined being (tap1, tap2) and (tap3, tap4), respectively.

According to the second step of the method, the first and the second pairs of taps, (tap1, tap2) and (tap3, tap4), respectively, are driven to detect the modulated signal reflected 17 from the scene during 2 cycles of the modulated signal.

Preferably, the first tap of a pair is driven by a first driving signal and the second tap of the pair is driven by a second driving signal being the inverted signal of the first driving signal. This is illustrated by FIG. 10, wherein the driving signals of tap1 and tap2 (respectively taps3 and tap4) are inverted i.e. the second driving signal is 180° phase-shifted compared to the first driving signal.

Even more preferably, the first driving signal of the first pair of tap corresponds to N cycles of the modulated signal 16 sent by the illumination unit and the first driving signal of the second pair of tap corresponds to N cycles of a 90° phase-shifted signal compared to the modulated signal 16 sent by the illumination unit.

This embodiment is also illustrated by FIG. 10. Indeed, the driving signal of tap1 corresponds to 2 cycles of the modulated signal 16 (or "light") and the driving signal of tap3 corresponds to 2 cycles of a 90° phase-shifted signal compared to the modulated signal 16.

In this particular example, driving signals sent to tap1, tap2, tap3 and tap4 correspond to 2 cycles of a 0°, 180°, 90° and 270° phase-shifted signal compared to the modulated signal sent by the illumination unit, respectively.

In the case of Y pairs of taps per pixel, the phase-shift between the driving signal for a pair 'y', y going from 0 to (Y−1), and the modulated signal sent by the illumination unit may for example be y*180°/Y for each next pair.

In this particular example, the first pair of taps may detect the reflected modulated light 17 following their respective driving signals during 2 cycles, and then, sequentially, the second pair of taps may detect the reflected modulated light 17 following their respective driving signals during 2 cycles. The fact of driving taps per pair enables avoiding overlap between the driving signals. This means that, inside one pixel, only one tap is active at a time while the others are inactive. This is clearly illustrated by FIG. 10. Thanks to this method, it is possible to reduce the bandwidth required for the taps and to avoid reducing the duty cycle of the driving signals.

In a further embodiment, the Time-of-Flight system may further be adapted to determine correlation measurements between a reference signal and the modulated signal reflected 17 from the scene. The method may further comprises the steps of, for each determined pair of taps, determining a first and a second correlation measurements between the modulated signal reflected 17 from the scene and a first and second reference signals, respectively.

For the first pair of taps, the first reference signal may correspond to the modulated signal 16 sent by the illumination unit and the second reference signal may be the inverted signal of the first reference signal.

For the second pair of taps, the first reference signal may correspond to a 90° phase-shifted signal compared to the modulated signal 16 sent by the illumination unit and the second reference signal may be the inverted signal of the first reference signal.

By referring to the notation previously introduced, Tap1 may be driven by a driving signal being 2 cycles of the modulated signal 16 sent by the illumination unit, and tap2 may be driven by a driving signal being 2 cycles of a 180° phase-shifted signal compared to the modulated signal 16 sent by the illumination unit. Furthermore, the first pair of taps (tap1, tap2) may determine correlation measurements between the modulated signal reflected from the scene 17 (or $S_\varphi$) and reference signals $S_I$ and $S_{\bar{I}}$, to obtain correlation measurements $S_{\varphi,I}$ and $S_{\varphi,\bar{I}}$. Tap1 may be attributed to the measure of $S_{\varphi,I}$ while tap2 may be attributed to the measure of $S_{\varphi,\bar{I}}$.

Similarly, Tap3 may be driven by a driving signal being 2 cycles of a 90° phase-shifted signal compared to the modulated signal sent by the illumination unit and tap4 may be driven by a driving signal being 2 cycles a 270° phase-shifted signal compared to the modulated signal sent by the illumination unit. Furthermore, the second pair of taps (tap3, tap4) may determine correlation measurements between the modulated signal reflected from the scene 17 (or $S_\varphi$) and reference signals $S_Q$ and $S_{\bar{Q}}$ to obtain correlation measurements $S_{\varphi,Q}$ and $S_{\varphi,\bar{Q}}$. Tap3 may be attributed to the measure of $S_{\varphi,Q}$ while tap4 may be attributed to the measure of $S_{\varphi,\bar{Q}}$.

This method enables measuring $S_\varphi$ by the four taps at almost the same time, which increases the accuracy and reliability of the measure and enables motion robustness. Preferably, the time spacing between each driving of pair should be as short as possible, for instance less than the duration of 8 cycles of the modulated light 16, to ensure high motion robustness. Preferably, the driving could be done alternatively, i.e. the first pair of taps could be driven first, then the second pair of taps could be driven and then the first pair of taps could be again driven. The detection could continue after N cycles for each pair in a periodic way.

If the imaging sensor comprises several pixels as illustrated by FIG. 4, then it should be understood that the driving signals sent to a set of taps may be the same. For example, the driving signals sent to tap1 could correspond to the ones sent to up-taps as defined before, the driving signals sent to tap2 could correspond to the ones sent to down-taps, the driving signals sent to tap3 could correspond to the ones sent right-taps and the driving signals sent to tap4 could correspond to the ones sent left-taps.

Furthermore, a first pair of taps could be (up-taps, down-taps) and a second pair of taps could be (right-taps, left-taps). Preferably, the taps comprised in a pair of taps have opposite position in the pixels. For example, if the taps form a square in a pixel, then the taps comprised in a pair of taps would be the ones being located in diagonal positions. Taps belonging to a pair of taps may belong to the same pixel.

It should be understood that terms up, down, right and left are not limiting terms and are used for clarity purposes.

The invention claimed is:

1. A method for driving a Time-of-Flight (ToF) system for use with an illumination system configured to illuminate a scene with a modulated signal, the ToF system having an imaging sensor comprising a plurality of pixels to detect a reflected modulated signal reflected from the scene, at least one pixel of the plurality of pixels comprising a first pair of taps and a second pair of taps, wherein each tap in the first pair of taps and the second pair of taps comprises a detection region and a control node surrounding the detection region, the method comprising, for each pixel of the at least one pixel:

driving the first pair of taps to detect the reflected modulated signal during a first predetermined number of cycles of the modulated signal, wherein driving the first pair of taps comprises applying a first driving voltage signal to a first control node of a first tap in the first pair of taps and applying a second driving voltage signal to a second control node of a second tap in the first pair of taps, wherein the second voltage signal includes voltage pulses 180° out of phase with light pulses in the modulated signal; and subsequent to driving the first pair of taps, driving the second pair of taps to detect the reflected modulated signal during a second predetermined number of cycles of the modulated signal, wherein driving the second pair of taps comprises applying a third driving voltage signal to a third control node of a third tap in the second pair of taps and applying a fourth driving voltage signal to a fourth control node of a fourth tap in the second pair of taps, wherein the third voltage signal includes voltage pulses 90° out of phase with the light pulses in the modulated signal.

2. A method according to claim 1, wherein the first predetermined number of cycles occur over a first time period, the second predetermined number of cycles occur over a second time period, and wherein the first time period and the second time period do not overlap in time.

3. A method according to claim 1, wherein the method further comprises:
for each of the first and second pairs of taps, determining a first correlation measurement and a second correlation measurement between the modulated signal reflected from the scene and first and second reference signals, respectively.

4. A method according to claim 3, wherein
for the first pair of taps, the first reference signal corresponds to the modulated signal sent by the illumination system and wherein the second reference signal is an inverted signal of the first reference signal; and
for the second pair of taps, the first reference signal corresponds to a 90° phase-shifted signal compared to the modulated signal sent by the illumination unit and wherein the second reference signal is an inverted signal of the first reference signal.

5. A method according to claim 1, wherein each pixel of the at least one pixel comprises four taps.

6. A Time-of-Flight (ToF) system for use with an illumination system configured to illuminate a scene with a modulated signal, the Time-of-Flight system comprising:
an imaging sensor comprising at least two pixels, each pixel of the at least two pixels comprising a first pair of taps and a second pair of taps, wherein each tap in the first pair of taps and the second pair of taps comprises a detection region and a control node surrounding the detection region;
a signal generator configured to generate driving signals for driving said first pair of taps and said second pair of taps; and
tap drivers configured to receive the driving signals from the signal generator and transmit the driving signals to the respective control nodes of the first pair of taps and the second pair of taps, wherein, each pixel comprises at least two pairs of taps to drive the first pair of taps to detect the reflected modulated signal during a first predetermined number of cycles of the modulated signal and, subsequent to driving the first pair of taps, to drive the second pair of taps to detect the reflected modulated signal during a second predetermined number of cycles of the modulated signal.

7. A Time-of-Flight system according to claim 6, wherein the driving signals include:
a first driving signal and a second driving signal provided by the tap drivers to a respective first and second tap of the first pair of taps, and
a third driving signal and fourth driving signal provided by the tap drivers to a respective third and fourth tap of the second pair of taps, and wherein at least the second driving signal is a phase-shifted signal compared to the modulated signal sent by the illumination system.

8. A Time-of-Flight system according to claim 7, wherein each of the second, third, and fourth driving signals is a phase-shifted signal compared to the modulated signal sent by the illumination system.

9. A Time-of-Flight system according to claim 8, wherein
the second driving signal is a 180° phase-shifted signal compared to the modulated signal sent by the illumination system,
the third driving signal is a 90° phase-shifted signal compared to the modulated signal sent by the illumination system, and
the fourth driving signal is a 270° phase-shifted signal compared to the modulated signal sent by the illumination system.

10. A Time-of-Flight system according to claim 6, wherein the first predetermined number of cycles of the modulated signal occur over a first time period the second predetermined number of cycles of the modulated signal occur over a second time period, and wherein the first time period and the second time period do not overlap in time.

11. A Time-of-Flight system according to claim 6, further comprising at least one multiplexer associated with the tap drivers.

12. A Time-of-Flight system according to claim 6, wherein each pixel comprises four taps.

13. A Time-of-Flight system according to claim 6, wherein each pixel is spatially organized to define a plurality of axes of symmetry.

14. A Time-of-Flight system according to claim 13, wherein each pixel is octagonally shaped.

15. A Time-of-Flight system according to claim 6, wherein the number of tap drivers is at least equal to the number of taps per pixel.

* * * * *